(12) United States Patent
Mehta et al.

(10) Patent No.: US 8,932,961 B2
(45) Date of Patent: Jan. 13, 2015

(54) CRITICAL DIMENSION AND PATTERN RECOGNITION STRUCTURES FOR DEVICES MANUFACTURED USING DOUBLE PATTERNING TECHNIQUES

(75) Inventors: Sohan Mehta, Saratoga Springs, NY (US); Tong Qing Chen, Fishkill, NY (US); Vikrant Chauhan, Beacon, NY (US); Ravi Srivastava, Fishkill, NY (US); Catherine Labelle, Wappingers Falls, NY (US); Mark Kelling, Marlboro, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 307 days.

(21) Appl. No.: 13/371,585

(22) Filed: Feb. 13, 2012

(65) Prior Publication Data

US 2013/0207108 A1  Aug. 15, 2013

(51) Int. Cl.
*H01L 21/306* (2006.01)
*H01L 21/311* (2006.01)

(52) U.S. Cl.
CPC ................................ *H01L 21/31144* (2013.01)
USPC .................... 438/736; 438/717; 257/E21.219; 257/E21.257

(58) Field of Classification Search
None
See application file for complete search history.

(56) References Cited

U.S. PATENT DOCUMENTS

| | | | |
|---|---|---|---|
| 6,449,031 B1 | 9/2002 | Grodnensky et al. | |
| 6,974,653 B2 | 12/2005 | Leung et al. | |
| 7,615,497 B2 | 11/2009 | Bok et al. | |
| 7,992,115 B2 | 8/2011 | Van Der Heijden et al. | |
| 8,658,346 B2 * | 2/2014 | Watanabe et al. | 430/312 |
| 2009/0225331 A1 * | 9/2009 | Van Haren | 356/614 |
| 2009/0246709 A1 * | 10/2009 | Nakasugi et al. | 430/319 |
| 2010/0301458 A1 | 12/2010 | Sewell et al. | |
| 2010/0311242 A1 | 12/2010 | Deng et al. | |
| 2011/0033799 A1 * | 2/2011 | Watanabe et al. | 430/270.1 |
| 2011/0042790 A1 | 2/2011 | Lin | |
| 2011/0051150 A1 | 3/2011 | Choi et al. | |
| 2011/0081618 A1 | 4/2011 | Wang et al. | |
| 2011/0091797 A1 | 4/2011 | Chang et al. | |
| 2011/0124134 A1 | 5/2011 | Lin et al. | |

OTHER PUBLICATIONS

Cho et al., "Double Patterning Technology Friendly Detailed Routing," Dept. of ECE, The University of Texas at Austin.
Ghaida et al., "Single-Mask Double-Patterning Lithography," Proc. of SPIE, vol. 7488, 2009.
Pan et al., "Layout Optimizations for Double Patterning Lithography," Dept. of ECE, The University of Texas at Austin.

\* cited by examiner

*Primary Examiner* — Matthew W Such
*Assistant Examiner* — Abul Kalam
(74) *Attorney, Agent, or Firm* — Amerson Law Firm, PLLC

(57) ABSTRACT

An illustrative test structure is disclosed herein that includes a plurality of first line features and a plurality of second line features. In this embodiment, each of the second line features have first and second opposing ends and the first and second line features are arranged in a grating pattern such that the first ends of the first line features are aligned to define a first side of the grating structure and the second ends of the first features are aligned to define a second side of the grating structure that is opposite the first side of the grating structure. The first end of the second line features has a first end that extends beyond the first side of the grating structure while the second end of the second line features has a first end that extends beyond the second side of the grating structure.

4 Claims, 6 Drawing Sheets

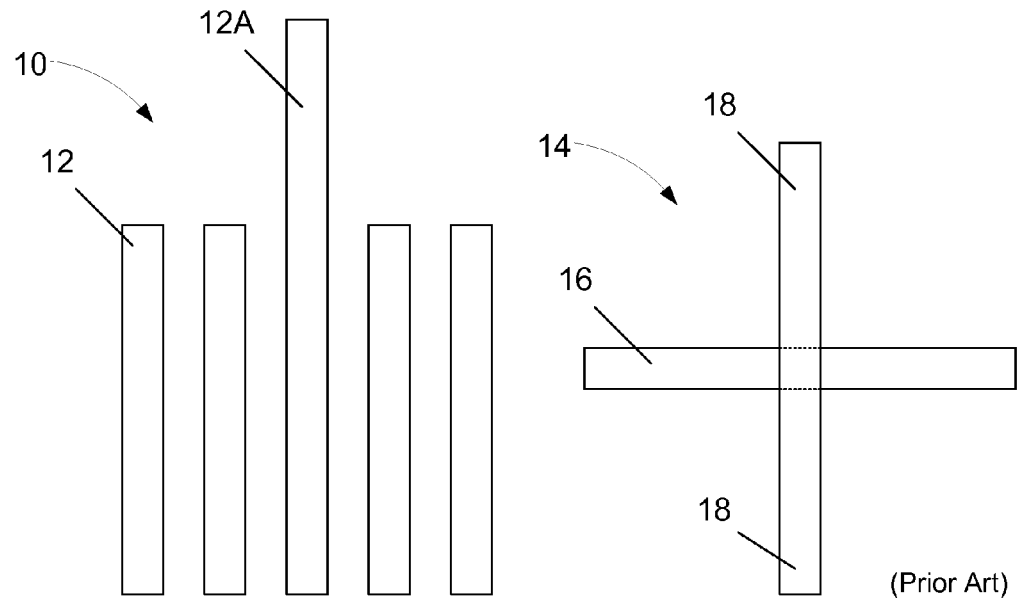
Figure 1A (Prior Art)
Figure 1B (Prior Art)
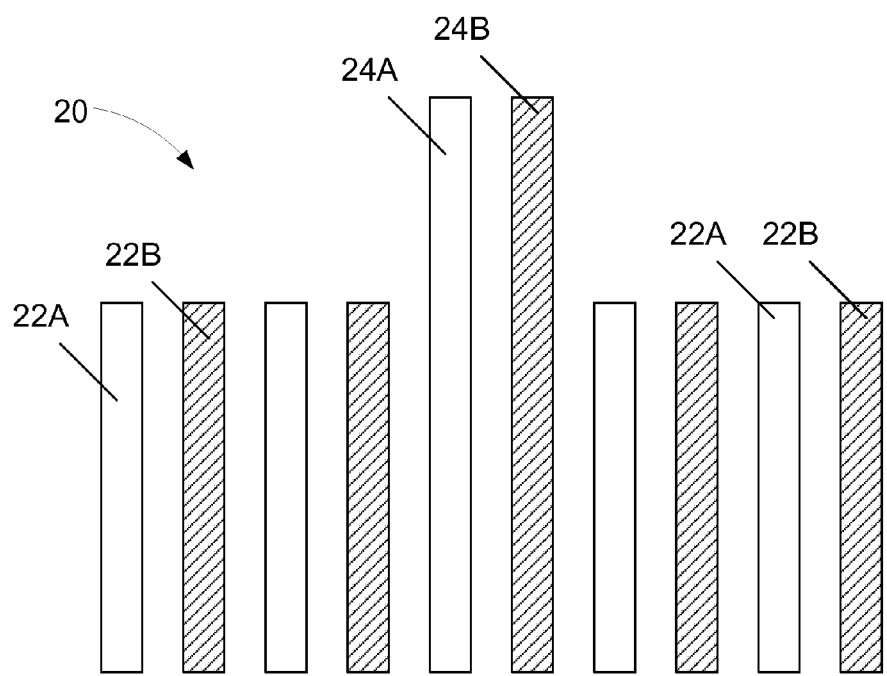
Figure 1C (Prior Art)

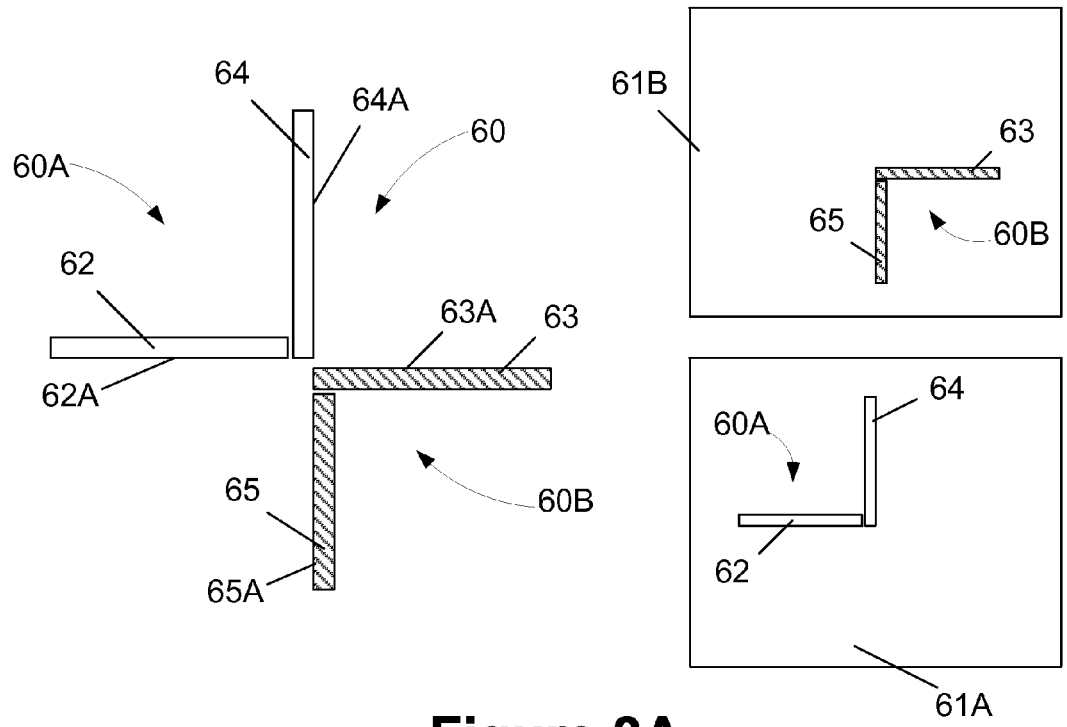
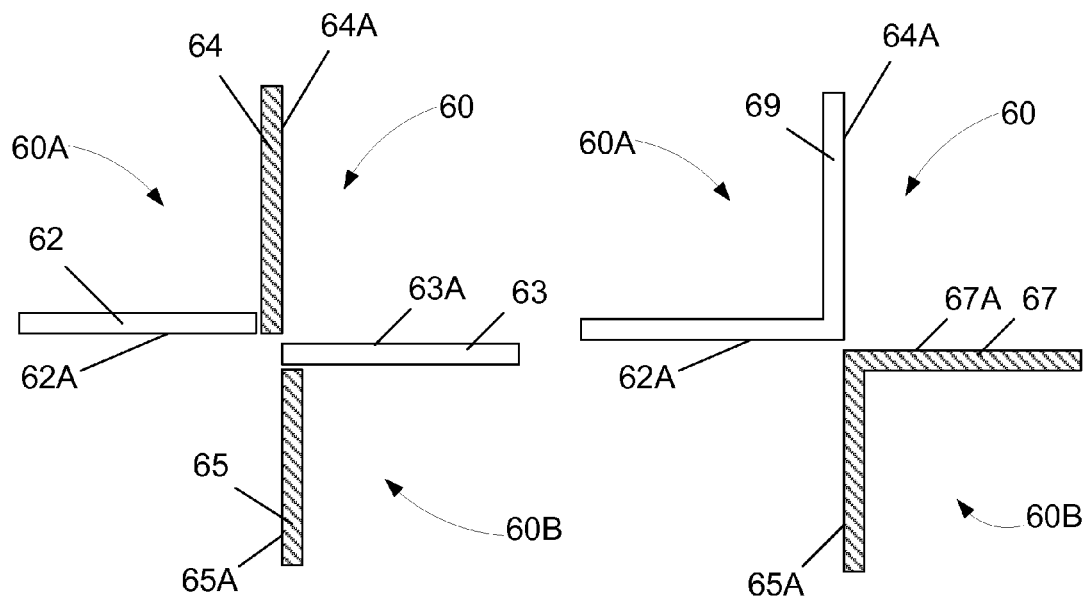
Figure 3A
Figure 3B
Figure 3C

CRITICAL DIMENSION AND PATTERN RECOGNITION STRUCTURES FOR DEVICES MANUFACTURED USING DOUBLE PATTERNING TECHNIQUES

BACKGROUND OF THE INVENTION

1. Field of the Invention

Generally, the present disclosure relates to the manufacturing of sophisticated semiconductor devices, and, more specifically, to structures that may be employed to analyze critical dimension variations and to pattern recognition marks that may be employed on devices manufactured using double patterning techniques.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NFET and PFET transistors) represent one important type of circuit element used in manufacturing such integrated circuit devices. A field effect transistor, irrespective of whether an NFET transistor or a PFET transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Fabricating such circuit elements involves forming various "features" of the devices, such as gate electrode structures, metal lines, conductive contacts, etc. Such features are typically formed by depositing a layer of material, forming a patterned mask layer above the layer of material and thereafter performing an etching process through the patterned mask layer to define the feature. In other cases, a trench may be formed in a layer of material by performing an etching process through a patterned mask layer and thereafter a desired feature, e.g., a metal line, may be formed in the trench. The deposition, masking and etching techniques are performed using a variety of known deposition, etching and photolithographic tools and techniques.

Each of these features has a so-called "critical dimension," which is typically the smallest size of a particular feature, e.g., the width of a line. As another example, for transistor devices, the critical dimension is gate length, which approximately corresponds to the width of the gate electrode that is positioned above the channel region of the device. Traditionally, a photoresist mask that is used in forming such features is formed by performing a single exposure through a reticle and thereafter developing the exposed photoresist layer that contains the "features" that will ultimately be transferred (by etching) to an underlying layer of material. That is, in past generation technologies, the feature size could be directly patterned in a photoresist mask layer in a single exposure process.

Over the recent years and continuing to present day, there has been a constant demand for electrical consumer devices with improved operating characteristics, such as operating speed, and for physically smaller devices. As a result, device designers have reduced the physical size of the various features that are used in manufacturing integrated circuit devices to increase their performance capability and to produce smaller devices with more functionality, e.g., cell phones. To be more specific, the gate length of current generation transistor devices has been reduced to about 25-30 nm, and further reductions are contemplated in the future. Advanced technology devices are being manufactured with feature sizes that approach or exceed the limits of existing 193 nm wavelength photolithography tools to reliably and repeatedly form such features to the desired feature size with the associated accuracy requirement that is inherent in manufacturing modern integrated circuit devices.

To overcome the limitations of current day photolithography tools and techniques, the semiconductor manufacturing industry has developed and employed several so-called double patterning techniques to be able to manufacture devices with features sizes that are smaller than can be patterned using a single exposure photolithography process. Double patterning generally involves the formation and use of two separate patterned photoresist mask layers instead of one to form the desired feature. Using these techniques, the second mask must be accurately aligned with the first mask. Two examples of known double patterning techniques includes a so-called LELE (Litho-Etch-Litho-Etch) process and a LFLE (Litho-Freeze-Litho-Etch) process. In addition to the requirement of a high degree of accuracy when using a double-mask double patterning process, as the density of the features formed on a chip increases, it is very important that the manufacturing process reliably and repeatedly produce device features where the critical dimensions of such features are maintained within very tight margins across the entirety of the wafer. Device manufacturers spend a great deal of time and effort to monitor critical dimension uniformity to insure that any critical dimension variations are within acceptable limits, and to identify potential processing errors. Device manufacturers also go to great lengths to insure that subsequent process layers are properly aligned with underlying features and layers so that the device will operate as intended.

By way of example, FIGS. 1A and 1B depict an illustrative prior art test structure 10 and a prior art pattern recognition mark 14, respectively, that have been employed in devices where features could be formed without resorting to double patterning techniques. For example, the prior art test structure 10 is a grating structure comprised of a plurality of densely-packed lines 12 and a single isolated line 12A. The features 12, 12A are all defined in a single mask layer and they are all formed at the same time by performing an etching process through the single mask layer. The features 12, 12A may correspond to gate electrodes that are formed at the same time as other operational gate electrodes are formed for an integrated circuit device. Such a test structure 10 may be used to analyze the critical dimension uniformity of a particular process flow. The test structure 10 has dense and isolated features so that manufacturers can analyze the effects, if any, on critical dimension uniformity as it relates to features formed in a densely packed area or an isolated area of the device. By stacking such test structures 10, the critical dimension uniformity of the process flow may be analyzed.

As noted previously, the prior art pattern recognition mark 14 was employed in devices where features could be directly patterned in a single exposure process, i.e., using a single patterned photoresist mask layer without resorting to the double patterning techniques discussed above. In this example, the pattern recognition mark 14 is in the form of a cross and it is comprised of a line feature 16 and an overlapping line feature 18 that are all defined in a single mask layer. The features 16, 18 may all be manufactured at the same time by performing an etching process through the single mask layer.

As noted above, the prior art test structure 10 and the pattern recognition mark 14 were manufactured using single-exposure, direct patterning techniques. FIG. 1C depicts a prior art test structure 20 that may be used to analyze or determine critical dimension uniformity in devices employing double patterning techniques, such as an LELE process. For example, the prior art test structure 20 is a grating structure comprised of a plurality of densely-packed lines 22A, 22B and a pair of isolated lines 24A, 24B positioned adjacent to one another. The features 22A, 22B, 24A and 24B are all formed using double patterning techniques. That is the features 22A and 24A are formed in the first masking layer while the features 22B and 24B are formed in a second masking layer. Ultimately, using double patterning techniques, the features in both the first and second mask will be transferred to a patterned hard mask layer. In practice, all of the features 22A, 22B, 24A, and 24B, e.g., lines or trenches, will be formed by performing a single etching process through the patterned hard mask layer. Such a test structure 20 may be used to analyze the critical dimension uniformity of a particular process flow. The test structure 20 has dense and isolated features so that manufacturers can analyze the effects, if any, on critical dimension uniformity as it relates to features formed in a densely packed area or an isolated area of the device.

The present disclosure is directed to structures that may be employed to analyze critical dimension variations and to pattern recognition marks that may be employed on devices manufactured using double patterning techniques.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to structures that may be employed to analyze critical dimension variations and to pattern recognition marks that may be employed on devices manufactured using double patterning techniques. In one example, an illustrative test structure disclosed herein includes a plurality of first line features having a first length, wherein each of the first line features have first and second opposing ends, and a plurality of second line features having a second length that is longer than the first length. In this embodiment, each of the second line features have first and second opposing ends and the first and second line features are arranged in a grating pattern such that the first ends of the first line features are aligned to define a first side of the grating structure and the second ends of the first features are aligned to define a second side of the grating structure that is opposite the first side of the grating structure. In this example, the first end of the second line features has a first end that extends beyond the first side of the grating structure, while a second end of the second line features has a first end that extends beyond the second side of the grating structure.

An illustrative pattern recognition mark disclosed herein includes a first portion that has first and second sides, the extension of which intersect to form a first right angle, and a second portion that has first and second sides, the extension of which intersect to form a second right angle. In some cases, the second portion of the pattern recognition mark is spaced apart from the first portion of the pattern recognition mark.

BRIEF DESCRIPTION OF THE DRAWINGS

The disclosure may be understood by reference to the following description taken in conjunction with the accompanying drawings, in which like reference numerals identify like elements, and in which:

FIGS. 1A-1C depict illustrative prior art critical dimension uniformity test structures and a prior art pattern recognition mark;

FIG. 3A-3C depict various illustrative embodiments of a pattern recognition mark disclosed herein that may be manufactured using double patterning techniques.

Figure 2:
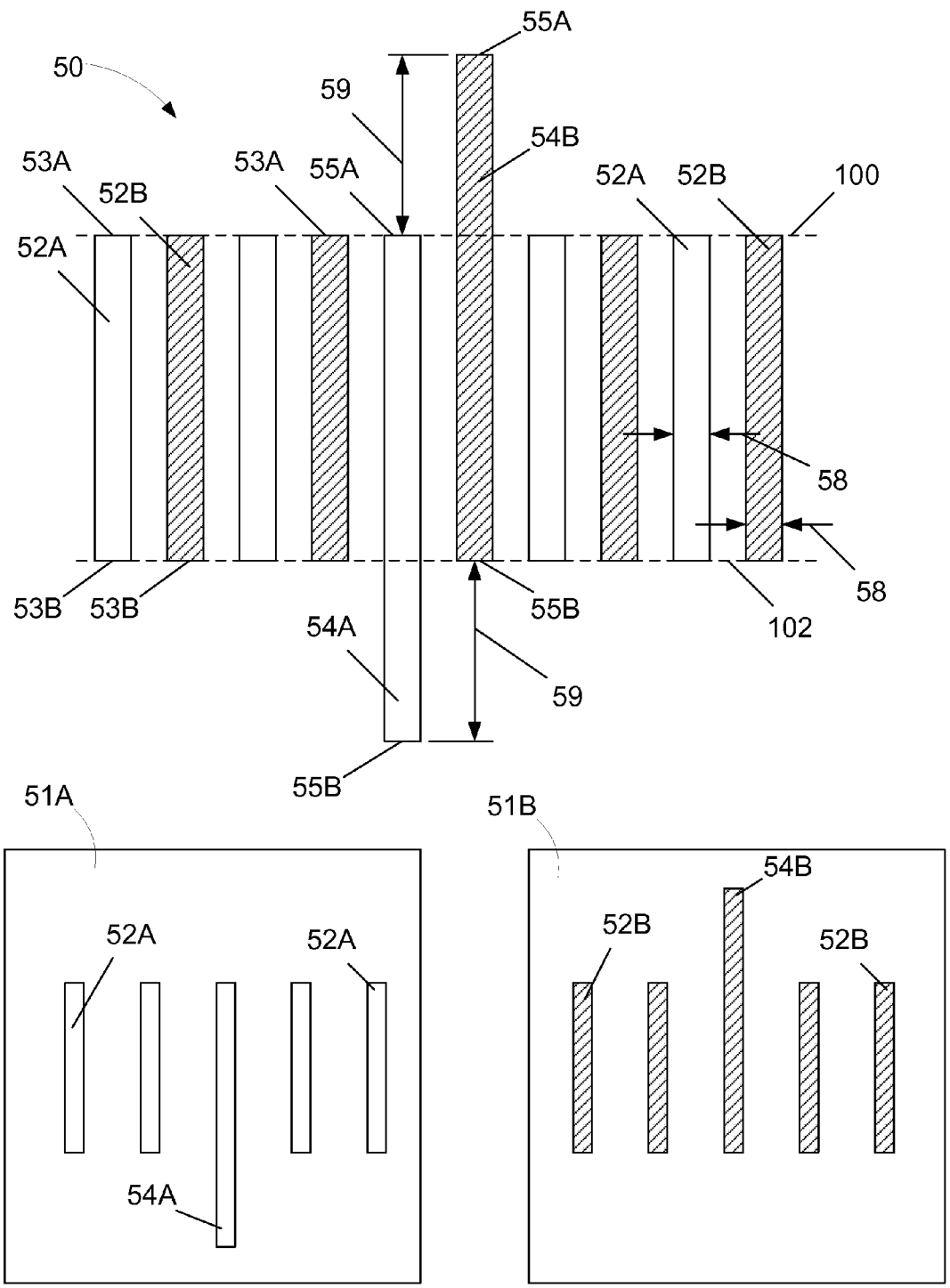
FIG. 2 depicts one illustrative embodiment of a test structure disclosed herein that may be employed in analyzing critical dimensions of various features on an integrated circuit device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to structures that may be employed to analyze critical dimension variations and to pattern recognition marks that may be employed on devices manufactured using double patterning techniques. As will be readily apparent to those skilled in the art upon a complete reading of the present application, the present method is applicable to a variety of technologies, e.g., NFET, PFET, CMOS, etc., and is readily applicable to a variety of devices, including, but not limited to, ASICs, logic devices, memory devices, etc. With reference to the attached drawings, various illustrative embodiments of the methods and devices disclosed herein will now be described in more detail.

FIG. 2 is a plan view of one illustrative embodiment of a novel test structure 50 disclosed herein that may be used to analyze or determine critical dimension uniformity in various integrated circuit devices. In one example, the test structure 50 may be manufactured using a double patterning technique, such as an LELE process, that involves use of a first patterned photoresist mask 51A and a second patterned photoresist mask 51B. In the illustrative example depicted in FIG. 2, the features 52A and 54A are defined in the first mask layer 51A, while the features 52B and 54B are defined in the second mask layer 51B. Of course, the number and arrangement of the various features of the test structure 50 that are present in each of the mask layers 51A, 51B may vary from the illustrative arrangement depicted in FIG. 2. The lines 52A, 52B have first and second ends 53A and 53B while the lines 54A, 54B have first and second ends 55A and 55B. The first ends 53A of the lines 52A, 52B are aligned and generally define a first side 100 of the grating structure (schematically depicted with a dashed line 100) while the second ends 53B of the lines 52A, 52B are aligned and generally define a second side of the grating structure (schematically depicted with a dashed line 102) that is opposite to the first side. The first end 55A of the line 54A is also aligned with the first side 100 of the grating structure while the second end 55B of the line 54A extends away from the second side 102 of the grating structure. The second end 55B of the line 54B is aligned with the second side 102 of the grating structure while the first end 55A of the line 54B extends away from the first side 100 of the grating structure.

In one embodiment, the features 52A, 52B, 54A and 54B, for example lines or trenches, are all formed using double patterning techniques. In practice, all of the features 52A, 52B, 54A, 54B, e.g., lines or trenches, will be formed in a single etching process that uses a mask, typically a hard mask, that reflects a final feature pattern defined by both the first and second masking layers of the double patterning process. One illustrative process flow for forming such features will be discussed more fully below. The test structure 50 disclosed herein may be used to analyze the critical dimension uniformity of a particular process flow. The oppositely-facing isolated lines 54A, 54B of the test structure 50 provide a more legitimate isolated environment for manufacturing isolated features, as compared to the test structure 20 shown in FIG. 1C wherein the so-called isolated features 24A, 24B are formed adjacent one another. The proximity of the lines 24A, 24B to each other in the prior art test structure 20 may distort the true critical dimension a particular process flow is producing for a production feature that is manufactured in a true isolated environment. The test structure 50 may be formed at any level of any type of an integrated circuit device. The number, size and critical dimension of the features 52A, 52B, 54A, 54B, as well as the overall foot-print occupied by the test structure 50, may vary depending on the particular device as well as the sizes of the features to be monitored. In one illustrative embodiment, the features 52A, 52B, 54A, 54B may be line-type features having a critical dimension 58 of about 25 nm or less. The isolated lines 54A, 54B may have a larger critical dimension of about 40 nm as compared to the features 52A, 52B. It is frequently the case that dense features and isolated features may have different critical dimensions. Similarly, the extended length 59 by which the isolated lines 54A, 54B extend beyond the nominal ends of the features 52A, 52B may likewise vary depending upon the particular application. In one illustrative embodiment, the extended length 59 may be a minimum distance of about 25 nm with no practical upper limit.

FIGS. 3A-3C depict various illustrative embodiments of a pattern recognition mark 60 disclosed herein that may be employed for alignment purposes when manufacturing integrated circuit devices. In the example depicted in FIG. 3A, the pattern recognition mark 60 is comprised of a first portion 60A and a second portion 60B. The first portion 60A of the pattern recognition mark 60 is comprised of features 62, 64, e.g., lines or trenches. The second portion 60B of the pattern recognition mark 60 is comprised of features 63, 65, e.g., lines or trenches. The first portion 60A has sides 62A, 64A, the projection of which toward the center of the pattern recognition mark 60 meet defines a right angle. Similarly, the second portion 60B has sides 63A, 65A, the projection of which toward the center of the pattern recognition mark 60 meet defines a second right angle.

In one example, the pattern recognition mark 60 may be manufactured using a double patterning technique, such as an LELE process, that involves use of a first patterned photoresist mask 61A and a second patterned photoresist mask 61B. In the illustrative example depicted in FIG. 3A, the features 62 and 64 are defined in a first patterned photoresist mask layer 61A, while the features 63 and 65 are defined in a second patterned photoresist mask layer 61B. Of course, the number and arrangement of the various features 62, 63, 64 and 65 of the pattern recognition mark 60 that are present in each of the mask layers 61A, 61B may vary from the illustrative arrangement depicted in FIG. 3A. Additionally the number, size and shape of the various features used to define the pattern recognition mark 60 may vary depending upon the particular application.

FIG. 3B depicts an alternative arrangement for the pattern recognition mark 60 whereby the features 62 and 63 are defined in a first patterned photoresist mask layer (not shown), while the features 64 and 65 are defined in a second patterned photoresist mask layer (not shown). FIG. 3C depicts yet another alternative arrangement for the pattern recognition mark 60 comprised of one-piece angled features 67 and 69. In this illustrative embodiment, the feature 67 may be defined in a first patterned photoresist mask layer (not shown), while the feature 69 may be defined in a second patterned photoresist mask layer (not shown).

Figure 4A:
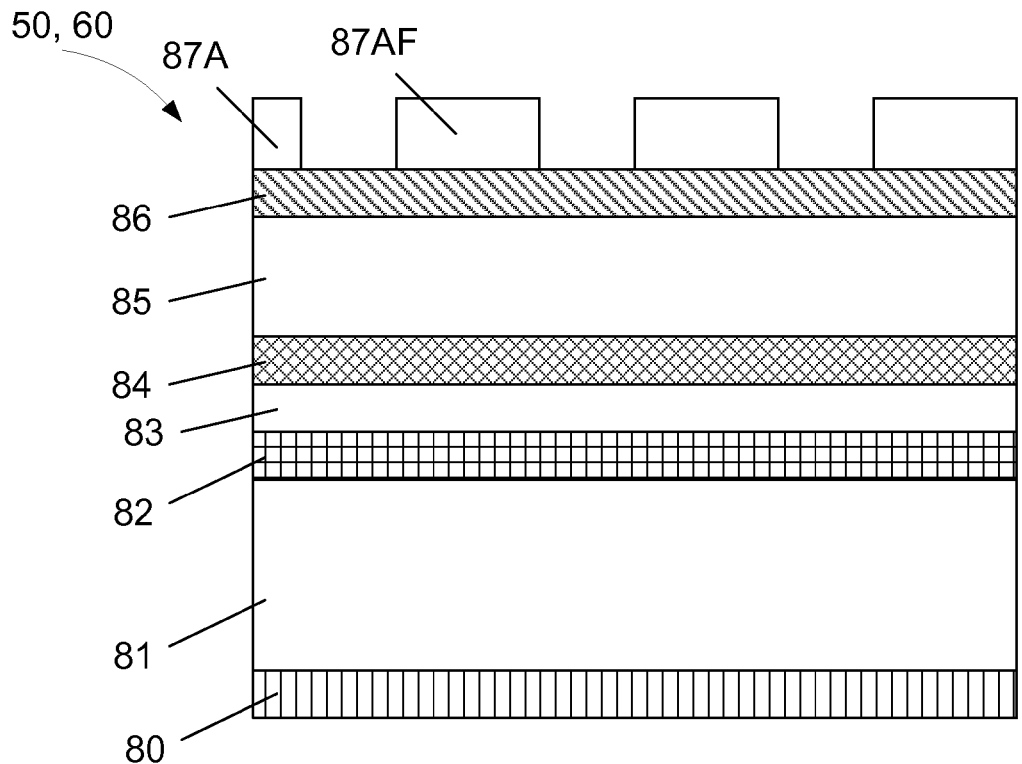
FIGS. 4A-4F depict one illustrative process flow for forming the test structures and the pattern recognition marks disclosed herein using a double patterning technique.

FIGS. 4A-4F depict an illustrative LELE double patterning process that may be employed to form the various embodiments of the test structure 50 and the pattern recognition mark 60 disclosed herein. FIG. 4A depicts an illustrative stack of material layers that may be employed in manufacturing the various embodiments of the test structure 50 and/or pattern recognition mark 60 disclosed herein. Of course, other material combinations may be employed, as will be appreciated by those skilled in the art after having benefit of the present disclosure.

FIG. 4A depicts an etch stop layer 80, a layer of insulating material 81, a first hard mask layer 82, a second hard mask layer 83, a so-called memorization layer 84, an organic planarization layer 85, an anti-reflective coating 86 and a first patterned photoresist mask layer 87A. Ultimately the features of the test structure 50 and pattern recognition mark 60 will be formed in the layer of insulating material 81. The various layers of material depicted in FIG. 4A may be comprised of a variety of different materials, they may have a variety of different thicknesses, and they may be formed by performing a variety of deposition processes, e.g., chemical vapor deposition (CVD), physical vapor deposition (PVD), atomic layer deposition (ALD), or plasma-enhanced versions of such processes. For example, in one illustrative embodiment, the etch stop layer 80 may be a layer of NBLOK or a layer of silicon nitride; the layer of insulating material 81 may be made of silicon dioxide, a high-k (k greater than 10) insulating material or a low-k insulating material; the first hard mask layer 82 may be a TEOS-based silicon dioxide; the second hard mask layer 83 may be made of a metal, such as titanium nitride; the memorization layer 84 may also be a TEOS-based silicon dioxide; and the anti-reflective coating 86 may be comprised of silicon.

The first patterned photoresist mask layer 87A may be made using known photolithographic tools and equipment. The first patterned photoresist mask layer 87A has been patterned to define various illustrative features 87AF that correspond to some, but not all, of the various features of the various embodiments of the test structure 50 and pattern recognition mark 60 disclosed herein. For example, the first patterned photoresist mask layer 87A may correspond to either of the first masking layers 51A or 61A discussed previously and shown above. For ease of description, no attempt has been made to make the features 87AF correspond to any of the specific features of the various embodiments of the test structure 50 and pattern recognition mark 60 disclosed herein.

Figure 4B:
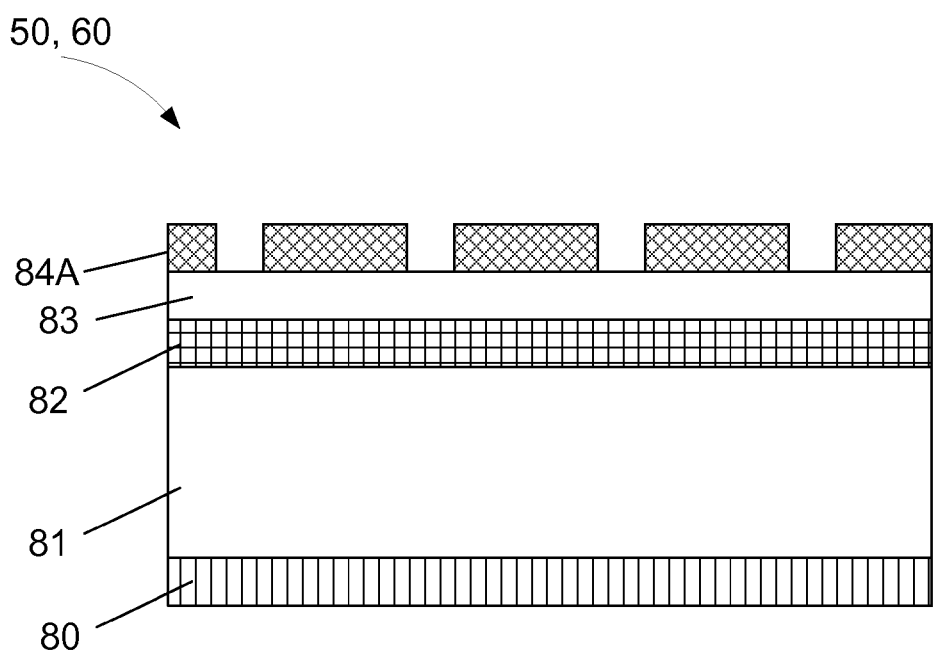

As shown in FIG. 4B, one or more etching processes has been performed though the first patterned photoresist mask layer 87A to transfer the pattern in the first patterned photoresist mask layer 87A to the underlying memorization layer 84, which has been renumbered as 84A to reflect this patterning.

Figure 4C:
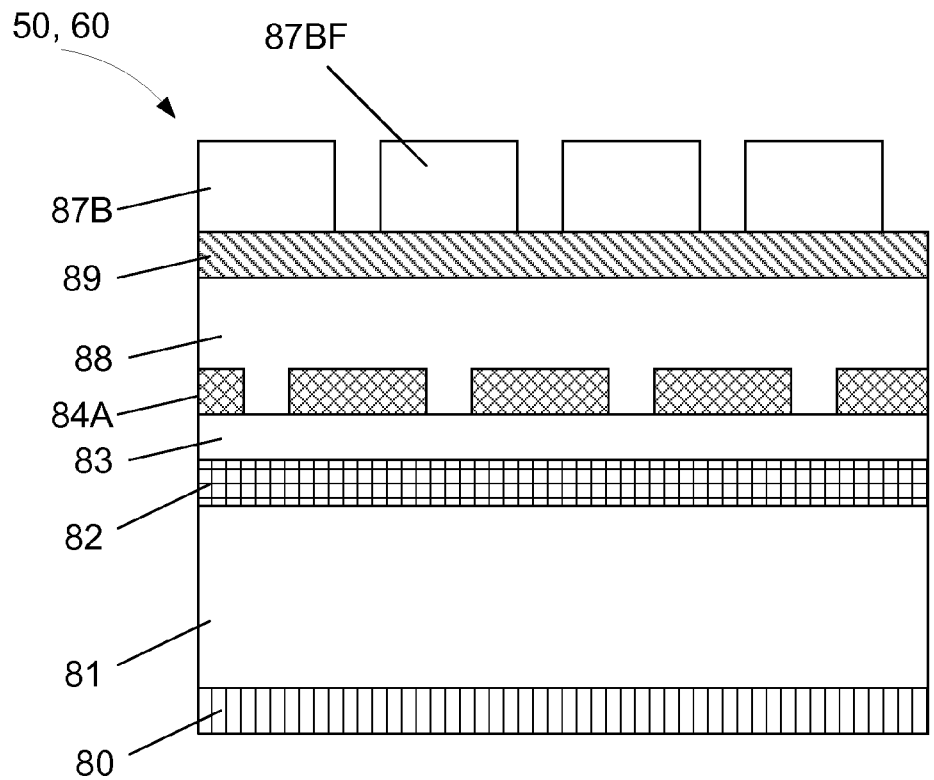

Next, as shown in FIG. 4C, another organic planarization layer 88, another anti-reflective coating layer 89 and a second patterned photoresist mask layer 87B has been formed above the patterned memorization layer 84A. The second patterned photoresist mask layer 87B may be made using known photolithographic tools and equipment. The second patterned photoresist mask layer 87B has been patterned to define various illustrative features 87BF that correspond to the features of the various embodiments of the test structure 50 and pattern recognition mark 60 that are not present in the first patterned photoresist mask layer 87A disclosed herein. For example, the second patterned photoresist mask layer 87B may correspond to either of the second masking layers 51B or 61B discussed previously and shown above. For ease of description, no attempt has been made to make the features 87BF correspond to any of the specific features of the various embodiments of the test structure 50 and pattern recognition mark 60 disclosed herein.

Figure 4D:
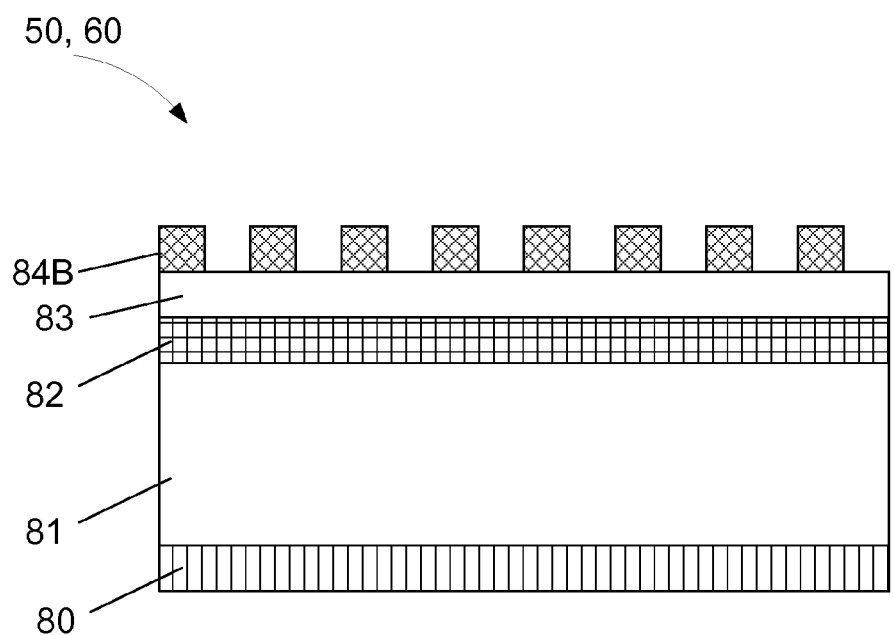

Next, as shown in FIG. 4D, one or more etching processes has been performed through the second patterned photoresist mask layer 87B to transfer the pattern in the second patterned photoresist mask layer 87B to the underlying patterned memorization layer 84A, which has been renumbered as 84B to reflect this additional patterning.

Figure 4E:
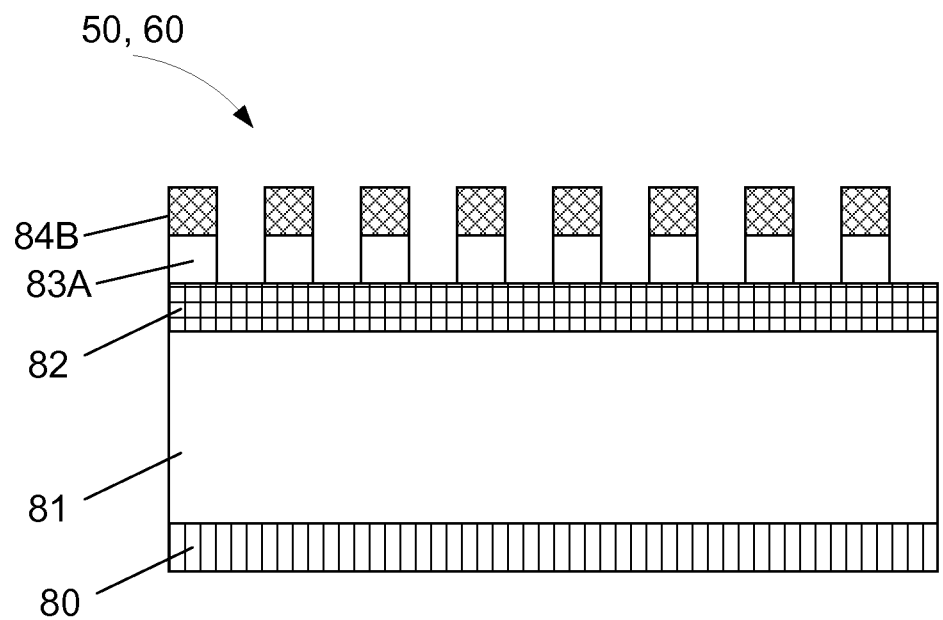

Next, as shown in FIG. 4E, one or more etching processes has been performed though the patterned memorization layer 84B to transfer the pattern in patterned memorization layer 84B to the underlying second hard mask layer 83, which has been renumbered as 83A to reflect this patterning.

Figure 4F:
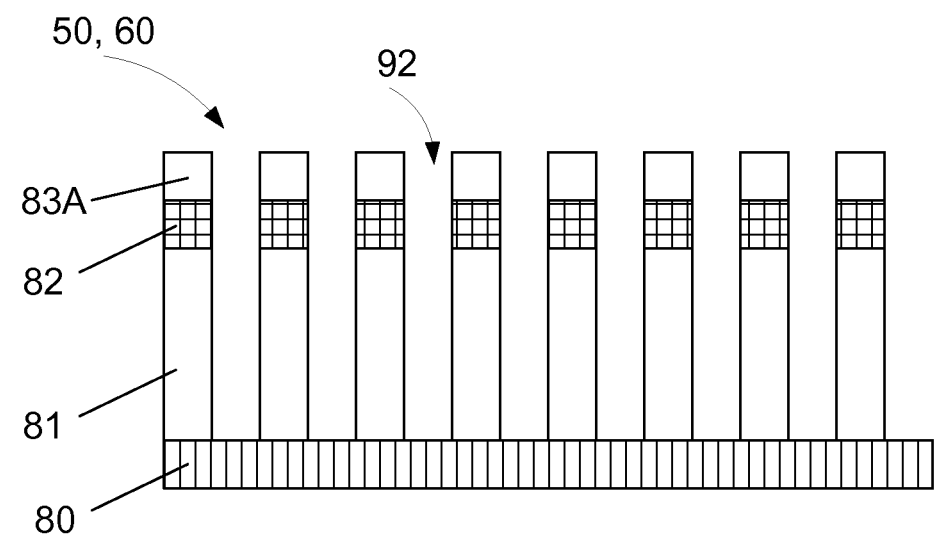

Then, as shown in FIG. 4F, the patterned memorization layer 84B has been removed and one or more etching processes has been performed though the patterned second hard mask layer 83A to transfer the pattern in the patterned second hard mask layer 83A to the underlying layer of insulating material 81. In this example, the process results in the definition of trenches or features 92 in the layer of insulating material 81. Using known techniques, the trenches 92 may be filled with a material, such as a metal, to define the features that make up the various embodiments of the test structure 50 and/or the pattern recognition mark 60 disclosed herein. In another example, the double patterning techniques disclosed herein may be employed to pattern line-type features, gate electrode structures for the test structure 50 disclosed herein, as well as the aforementioned trenches.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a pattern recognition mark, comprising:
    forming a first hard mask layer on a layer of material;
    forming a second hard mask layer on said first hard mask layer;
    forming a memorization layer on said second hard mask layer;
    forming a first patterned photoresist mask above said memorization layer, said first patterned photoresist mask having a first feature pattern corresponding to at least a first portion of said pattern recognition mark;
    performing at least one first etching process through said first patterned photoresist mask on said memorization layer to transfer said first feature pattern to said memorization layer and thereby define a partially patterned memorization layer;
    forming a second patterned photoresist mask above said partially patterned memorization layer, said second patterned photoresist mask having a second feature pattern corresponding to at least a second portion of said pattern recognition mark;
    performing at least one second etching process through said second patterned photoresist mask on said partially patterned memorization layer to transfer said second feature pattern to said partially patterned memorization layer and thereby define a fully patterned memorization layer having a memorization layer pattern;
    performing at least one third etching process through said fully patterned memorization layer on said second hard mask layer to define said pattern recognition mark in a fully patterned second hard mask layer; and
    performing at least one fourth etching process through said fully patterned second hard mask layer on said first hard mask layer and said layer of material to define a pattern recognition mark in said layer of material.

2. The method of claim 1, further comprising forming said layer of material on an etch stop layer.

3. The method of claim 1, further comprising forming an organic planarization layer on said memorization layer and forming an anti-reflective coating on said organic planarization layer.

4. The method of claim 1, further comprising removing said fully patterned memorization layer prior to performing said at least one fourth etching process through said fully patterned second hard mask layer.

\* \* \* \* \*